(12) United States Patent
Seko et al.

(10) Patent No.: US 7,565,637 B2
(45) Date of Patent: Jul. 21, 2009

(54) METHOD OF DESIGNING PACKAGE FOR SEMICONDUCTOR DEVICE, LAYOUT DESIGN TOOL FOR PERFORMING THE SAME, AND METHOD OF MANUFACTURING SEMICONDUCTOR DEVICE USING THE SAME

(75) Inventors: Koichi Seko, Osaka (JP); Shinya Tokunaga, Kyoto (JP)

(73) Assignee: Panasonic Corporation, Osaka (JP)

( * ) Notice: Subject to any disclaimer, the term of this patent is extended or adjusted under 35 U.S.C. 154(b) by 172 days.

(21) Appl. No.: 11/592,168

(22) Filed: Nov. 3, 2006

(65) Prior Publication Data

US 2007/0105271 A1    May 10, 2007

(30) Foreign Application Priority Data

Nov. 4, 2005    (JP)    ............... 2005-321169

(51) Int. Cl.
*G06F 17/50* (2006.01)
(52) U.S. Cl. ............... 716/10; 716/8; 716/9; 703/2; 703/4; 702/57; 438/106; 257/665; 257/678
(58) Field of Classification Search ............... 716/8–10; 703/2, 14; 702/57; 438/106; 257/665, 678
See application file for complete search history.

(56) References Cited

U.S. PATENT DOCUMENTS

| | | | |
|---|---|---|---|
| 6,046,495 | A | 4/2000 | Urushima |
| 6,114,751 | A * | 9/2000 | Kumakura et al. ............ 257/666 |
| 6,208,497 | B1 * | 3/2001 | Seale et al. ................. 361/160 |
| 6,405,348 | B1 * | 6/2002 | Fallah-Tehrani et al. ....... 716/4 |
| 6,424,027 | B1 | 7/2002 | Lamson et al. |
| 6,608,375 | B2 * | 8/2003 | Terui et al. ................. 257/691 |
| 6,687,881 | B2 * | 2/2004 | Gauthier et al. ............. 716/2 |
| 6,694,503 | B2 * | 2/2004 | Minakuti et al. ............. 716/19 |
| 6,820,046 | B1 * | 11/2004 | Lamson et al. .............. 703/14 |

(Continued)

FOREIGN PATENT DOCUMENTS

JP    2001-94014 A    4/2001

(Continued)

OTHER PUBLICATIONS

Gong et al., "Packaging impact on switching noise in high-speed digital systems", Circuits, Devices and Systems, IEEE Proceedings—vol. 145, Issue 6, Dec. 1998. pp. 446-452.*

*Primary Examiner*—Jack Chiang
*Assistant Examiner*—Naum B Levin
(74) *Attorney, Agent, or Firm*—McDermott Will & Emery LLP

(57) ABSTRACT

A package design method for a semiconductor device of designing a package including a package substrate provided with a wiring pattern, a chip mounted on the package substrate, and a sealing resin which covers the package substrate and the chip, and the wiring pattern including an external connection terminal and an internal connection terminal connected to the chip, the method comprising: setting an acceptable noise value of the package; designing a package layout on the basis of information on connection between the package substrate and the chip; and performing an optimization on package layout data so that an amount of noises remains within a range which is set beforehand, on the basis of the package layout data obtained in the designing process of the package layout.

15 Claims, 7 Drawing Sheets

U.S. PATENT DOCUMENTS

| | | | |
|---|---|---|---|
| 6,834,380 B2 * | 12/2004 | Khazei | 716/10 |
| 6,875,920 B2 * | 4/2005 | Nakamura et al. | 174/549 |
| 6,915,249 B1 * | 7/2005 | Sato et al. | 703/14 |
| 6,975,977 B2 * | 12/2005 | Gauthier et al. | 703/14 |
| 7,231,618 B2 * | 6/2007 | Huang et al. | 716/4 |
| 7,269,521 B2 * | 9/2007 | Hsu et al. | 702/57 |
| 7,359,843 B1 * | 4/2008 | Keller et al. | 703/2 |
| 7,412,668 B1 * | 8/2008 | Duong | 716/1 |
| 2005/0232066 A1 * | 10/2005 | Ishibashi et al. | 365/233 |

FOREIGN PATENT DOCUMENTS

JP  2003-086721  3/2003

\* cited by examiner

METHOD OF DESIGNING PACKAGE FOR SEMICONDUCTOR DEVICE, LAYOUT DESIGN TOOL FOR PERFORMING THE SAME, AND METHOD OF MANUFACTURING SEMICONDUCTOR DEVICE USING THE SAME

BACKGROUND OF THE INVENTION

The present invention relates to a method of designing package for a semiconductor device, to a layout design tool for performing the same, and to a method of manufacturing a semiconductor device using the same.

In a known package design method for a semiconductor device, it is checked the positions of external connection terminals, such as bumps, connected to predetermined terminals of an LSI and the positions of pins connected to substrate-side terminals electrically connected to the external connection terminals such as the bumps, an examination on a connection method is made, and then a wiring process is performed. In recent years, a wiring process is automated but it is not possible to apply a tool to all wiring lines. Therefore, in order to suppress wiring noises, a design engineer has examined states of respective signal lines and set a wiring path and a wiring line width such that resistance, capacitance, and inductance parasitic on the respective wiring lines are close to each other in a uniform manner.

However, for the purpose of optimization of the resistance, capacitance, and inductance, it is necessary to individually and repeatedly modify the resistance, the capacitance, and the inductance and a modification method uses the know-how based on experience. Accordingly, for new factors or unexpected specifications, noises cannot be completely suppressed, which causes a problem in that the noises due to the new factors or unexpected specifications should be solved by using an externally mounted circuit.

Here, the noise refers to a difference between an ideal waveform and a signal waveform, which occurs due to resistance, capacitance, and inductance parasitic on signal lines, and types of the difference includes overshoot, undershoot, slue, and the like. The slue means a slope of a signal waveform.

FIG. 11 is a flow chart illustrating a package design method in the related art. In FIG. 11, reference numeral 107 denotes a step of determining a wiring path and a wiring line width, reference numeral 102 denotes a layout design step, reference numeral 103 denotes a layout information extracting step, reference numeral 105 denotes a layout modifying step, reference numeral 109 denotes an C·C·R optimization examining step, reference numeral 108 denotes an C·C·R check step, and reference numeral 106 denotes a design completing step.

In a known package design method, first, an examination on wiring lines is made in the step 107 of determining a wiring path and a wiring line width, and then a wiring process is performed in the layout design step 102. At this time, the examination on wiring lines is made on the basis of experience of an engineer.

Then, the resistance, capacitance, and inductance parasitic on the signal lines are extracted in the layout information extracting step 103, and then values thereof are checked in the C·C·R check step 108. Here, L denotes inductance, C denotes capacitance, and R denotes resistance. At this time, if expected values and the extracted values are greatly different from each other, an examination is made such that each of the resistance, capacitance, and inductance can be optimized in the L·C·R optimization examining step 109, and then a wiring line layout is modified according to the examination result in the layout modifying step 105.

Thereafter, the layout design step 102 is performed, then information on parasitic components is extracted in the layout information extracting step 103, and then the values of the resistance, capacitance, and inductance are checked in the L·C·R check step 108. By repeatedly performing the processes described above, each value of a signal line exists within an allowable level in the L·C·R check step 108, thereby realizing a package design by which noises can be suppressed. Patent Document 1 is exemplified below.

[Patent Document 1] JP-A-2001-94014

In a known package design method for a semiconductor device, when wiring signal lines, a design engineer should examine the states of respective signal lines, expect resistance, capacitance, and inductance parasitic on each of the signal lines, and set a wiring path, a wiring line width, a wiring line length such that the parasitic components of the respective signal lines are close to each other in a uniform manner.

However, in the known method, a unit that optimizes the resistance, capacitance, and inductance parasitic on signal lines individually modifies the resistance, capacitance, and inductance. As a result, for example, even if one of the resistance, capacitance, and inductance becomes optimized, the others are not easily optimized. Accordingly, the know-how based on experience is required for the optimization but design engineers having a corresponding technology are limited. This has caused a problem in that process automation due to a tool or the like and the improvement of efficiency of flow due to process simplification are not possible. In addition, since the number of wiring lines required for a package increases every year as the circuit size of an LSI is large, the time required for design also increases due to an increase of the number of layout modification times.

In addition, as the LSI has a high performance, input and output signals need high frequencies. In this case, the layout is not only modified, but a filter serving to remove high-frequency components, which are not needed, is often mounted in the package so as to prevent signal noises.

FIG. 12 is a flow chart illustrating a package design method of designing a package, in which a filter is mounted, in Patent Document 1. In FIG. 12, reference numeral 110 denotes a filter interposing step.

In recent years, it is required that input and output signals also have high frequencies. Accordingly, even if desired values are obtained as values of the resistance, capacitance, and inductance parasitic on wiring lines in the L·C·R check step 108, unexpected noises has often occurred to cause a product to malfunction. In this case, the malfunction due to noises is prevented by modifying the layout by means of optimization of parasitic components and mounting a filter, which removes unnecessary high-frequency components, in a package.

However, since it is necessary to prepare other circuits in the package, additional processes are needed and prices of components increases. In addition, since resistance, capacitance, and inductance due to a mounted filter occur, it may be necessary to modify an error from a desired value. Even in this case, since other processes are added and prices of components increase, a problem occurs.

SUMMARY OF THE INVENTION

The invention has been finalized in view of the drawbacks inherent in the related art, and it is an object of the invention to provide a method of designing package for a semiconductor device capable of suppressing noises on a signal line and preventing a circuit from malfunctioning. In the invention, it is not necessary to mount a component for preventing noises and a product manufacturing cost is saved. In addition, it is another object of the invention to reduce the number of development processes by reducing the number of repeated processes.

In order to achieve the above objects of the invention, according to an aspect of the invention, a package design method is characterized in that a difference between an ideal signal waveform and an expected signal waveform at the time of verification is checked, analysis of a cause and optimization are performed, and a design flow in which signal noises are suppressed is introduced.

That is, according to the aspect of the invention, there is provided a method of designing a package including a package substrate provided with a wiring pattern, a chip mounted on the package substrate, and a sealing resin which covers the package substrate and the chip, and the wiring pattern including an external connection terminal and an internal connection terminal connected to the chip, the method comprising:

setting an acceptable noise value of the package;

designing a package layout on the basis of information on connection between the package substrate and the chip; and performing an optimization on package layout data so that an amount of noises remains within a range which is set beforehand, on the basis of the package layout data obtained in the designing process of the package layout.

In the method described above, an acceptable noise value in a package is set beforehand and the layout is designed such that noises in the entire package remain within the set value. Accordingly, even in the case when a filter or the like is mounted, it is possible to perform the package layout design in consideration of noise information on the entire package. As a result, since it is possible to perform the layout design without an additional component such as a filter, a simple layout design can be performed at high speed.

Further, in the package design method, preferably, the performing process of the optimization on the layout data includes: analyzing data input to the package and data output from the package; and modifying the layout data on the basis of an analysis result obtained in the analyzing process.

In the invention, since the layout data is modified on the basis of the analysis result on the data input to the package and the data output from the package, it is possible to very simply perform the layout design in which noises due to the entire package exist within an allowable range. As a result, it is possible to obtain a highly reliable package with low cost. In addition, even when a chip of an LSI mounted in the package needs to be changed, it can be easily modified by changing the input data, which makes it possible to realize a highly reliable package design.

Furthermore, in the package design method, preferably, the analyzing process includes comparing an input waveform input to the internal connection terminal with an output waveform output from the external connection terminal and verifying the input waveform and the output waveform.

Also, the analyzing process includes checking a difference between an ideal waveform and the input and output waveforms.

In the invention, the input waveform input to the internal connection terminal is compared with the output waveform output from the external connection terminal and then the input and output waveforms are verified. Accordingly, the modification can be made with high precision by calculating a difference between an ideal waveform and the input and output waveforms and performing layout modification such that the input and output waveforms become close to the ideal waveform. In addition, it may be possible to perform the cause analysis and then make the modification on the basis of a result of the analysis.

Furthermore, in the package design method, preferably, the setting of the acceptable noise value further includes setting a wiring limitation.

In the invention, since the wiring limitation as well as the acceptable noise value is set beforehand, it is possible to realize a desired layout design with better efficiency.

Furthermore, in the package design method, preferably, the performing process of the optimization is conducted based on circuit information on the chip in addition to the analysis result.

In the invention, since the circuit information on the chip as well as the analysis result is considered, it is possible to modify the package layout in a very short time even when the chip needs to be changed.

Furthermore, in the package design method, preferably, the performing process of the optimization includes modifying the package layout data on the basis of a simulation result based on circuit information on the chip in addition to the analysis result.

In the invention, since the package layout data is modified on the basis of the simulation result based on circuit information on the chip, it is possible to independently analyze the chip and the package and then to modify the package on the basis of the analysis result on the chip and the package.

Furthermore, in the package design method, preferably, the package layout data includes information on a width of the wiring pattern and information on arrangement of the wiring pattern.

In the invention, since the information on the width of the wiring pattern and the information on arrangement of the wiring pattern are considered, a highly reliable package design can be realized with high precision.

Furthermore, in the package design method, preferably, the package layout data includes information on the position of the external connection terminal and information on the size of the external connection terminal.

In the invention, since the information on the position of the external connection terminal, such as a solder ball, and the information on the size of the external connection terminal are considered, the highly reliable package design can be realized with high precision.

Furthermore, in the package design method, preferably, the setting process of the acceptable noise value includes setting an acceptable overshoot value with respect to a signal waveform.

Furthermore, in the package design method, preferably, the setting process of the acceptable noise value includes setting an acceptable undershoot value with respect to a signal waveform.

Furthermore, in the package design method, preferably, the setting process of the acceptable noise value includes setting an allowable slue value with respect to a signal waveform.

Furthermore, in the package design method, preferably, the designing process of the package layout includes designing the package layout on the basis of the information on connection between the package substrate and the chip and information on the sealing resin.

In the invention, it is possible to efficiently perform the package design with high precision.

Furthermore, in the package design method, preferably, the designing process of the package layout further includes designing the package layout on the basis of information on an additional component to be mounted on the package.

In the invention, even when an additional component, such as a filter, is mounted on the package substrate, it is possible to efficiently perform the layout design in consideration of the additional component.

Furthermore, in the package design method, preferably, the additional component is a filter formed on the package substrate.

In addition, according to another aspect of the invention, there is provided a layout design tool for performing the above-described package design method for a semiconductor device.

In the invention, it is possible to efficiently perform the package design with a simple configuration. For example, the design tool includes a CPU, a RAM, an input I/F, a display I/F, and an input and output I/F, which are connected to one another through a bus such that data communication therebetween can be performed.

In addition, according to still another aspect of the invention, there is provided a method of manufacturing a semiconductor device using the above-described package design method for a semiconductor device.

In the invention, when performing layout design for a package design, an allowable value of noise with respect to a signal is set, a difference between an ideal signal waveform and an expected signal waveform at the time of verification is checked, and analysis of a cause and an optimized design flow is prepared. Thus, overall optimization based on the wiring information can be achieved, without separately corresponding to parasitic resistance, parasitic capacitance, and parasitic inductance. In addition, by the design flow optimization, it is possible to prevent repeated processes in a post-process, to perform a process based on a tool or the process automation, and to improve the flow efficiency due to process simplification.

In the invention, by using the package design method described above, it is possible to realize the package design in which noises are suppressed within the allowable value. For example, it is possible to suppress a product from malfunctioning due to noises. In addition, since the optimization is performed in a pre-process and a wiring process and a process of checking the wiring result are performed in a post-process, it is possible to suppress the number of repeated processes from increasing. In addition, since the automation is possible without depending on a limited number of design engineers, it is possible to improve the design efficiency through process simplification.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

First Embodiment

Hereinafter, a first embodiment of the invention will be described.

Figure 1:
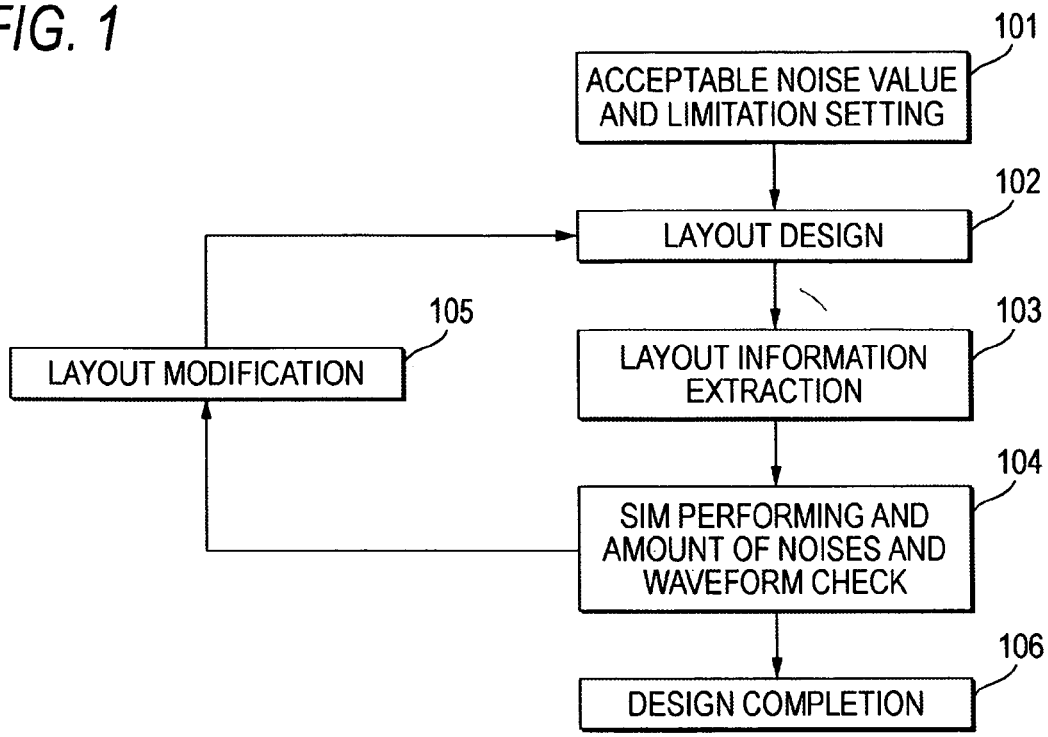
FIG. 1 is a flow chart illustrating a package design method according to a first embodiment of the invention.

In this method, as shown in FIG. 1, a layout of a package is designed, layout information is extracted, simulation is performed on the basis of the layout information and an amount of noises and a waveform are checked (step 104), the layout is modified after the simulation (modification step 105), and the modified data is added in layout design data in the layout design step 102. Thus, the package layout design is realized by performing the optimization in a collective manner.

Before explaining the layout design, a package, noises thereof, and allowable values thereof will be described.

Figure 9A:
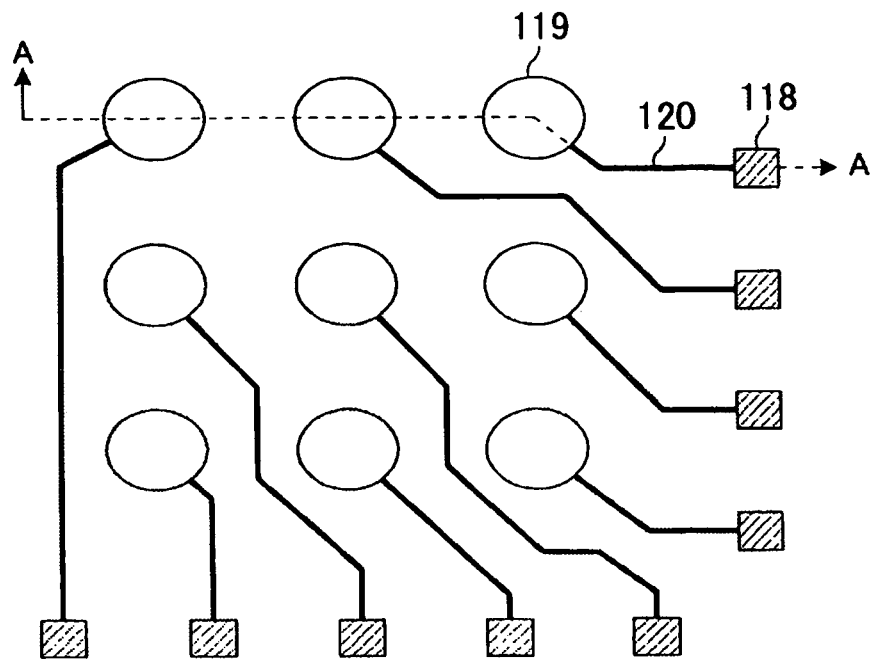
FIG. 9A is a view illustrating a package for a semiconductor device for realizing the design method according to the embodiment of the invention.
Figure 9B:
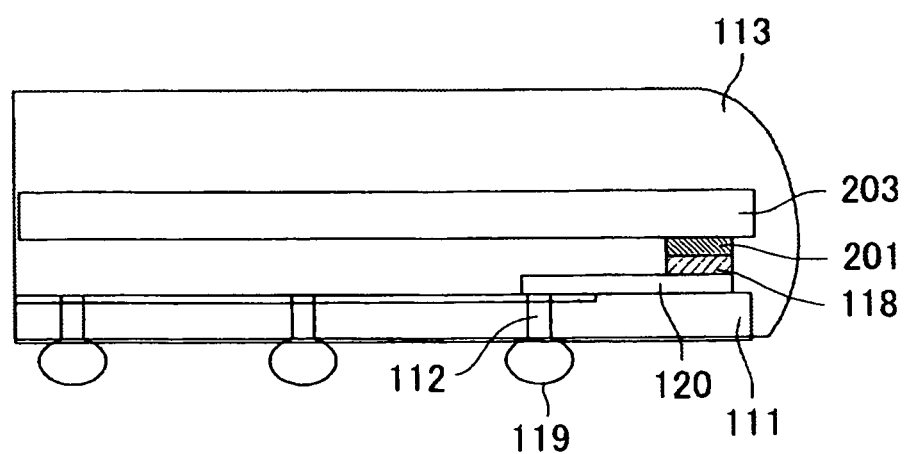
FIG. 9B is a view illustrating a package for a semiconductor device for realizing the design method according to the embodiment of the invention.

FIG. 9A is an explanatory view illustrating an example of wiring lines as viewed from a bottom side of a package, and 9B is a cross-sectional view taken along the line IXB-IXB of FIG. 9A. In FIG. 9, reference numeral 118 denotes a bump, reference numeral 119 denotes a pin (solder ball), and reference numeral 120 denotes a signal line. In general, the pin 119 protrudes from a bottom surface of a ceramic substrate 111, and patterns of the signal lines 120 are formed on an upper surface of the substrate 111 with a through hole 112 interposed between the pin 119 and the signal line 120. In addition, the bump 118 is connected to a pad 201 of an LSI chip 203, a resin package 113 is formed to surround the entire LSI chip 203.

The bump 118 serves to connect a pad of a mounted LSI with a signal line of a package. The bump 118 is disposed at the most suitable place according to the type of a package and an arrangement state of pads of the LSI. The pin 119 serves to connect a signal line of a package, an external circuit, and a terminal to one another. The pin 119 is disposed at the most suitable place according to a state of a substrate on which the package is to be mounted. The signal line 120 serves to electrically connect the bump 118 with the pin 119.

Since noises due to a package are mainly determined by arrangement of the entire package, the signal line 120, and the bump 118 even though the noises due to the package occur depending on the disposition in the entire package, only the arrangement of the entire package, the signal line 120, and the bump 118 will be considered herein.

Figure 10:
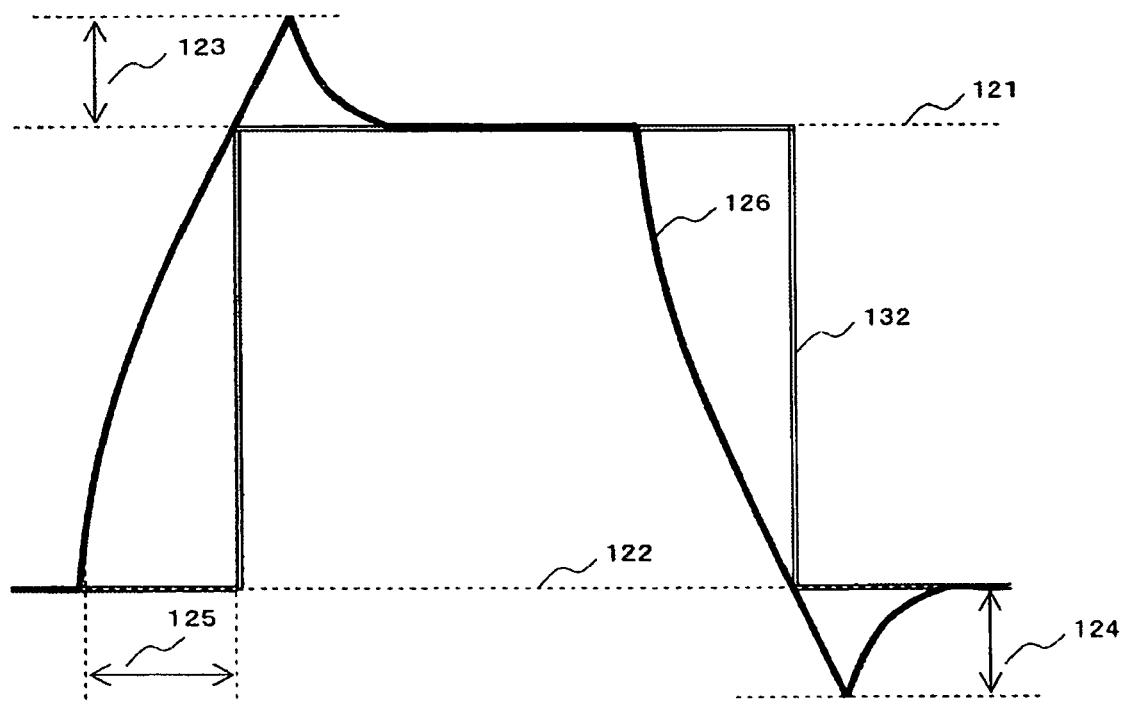
FIG. 10 is an explanatory view illustrating an allowable value of noise.
Figure 11:
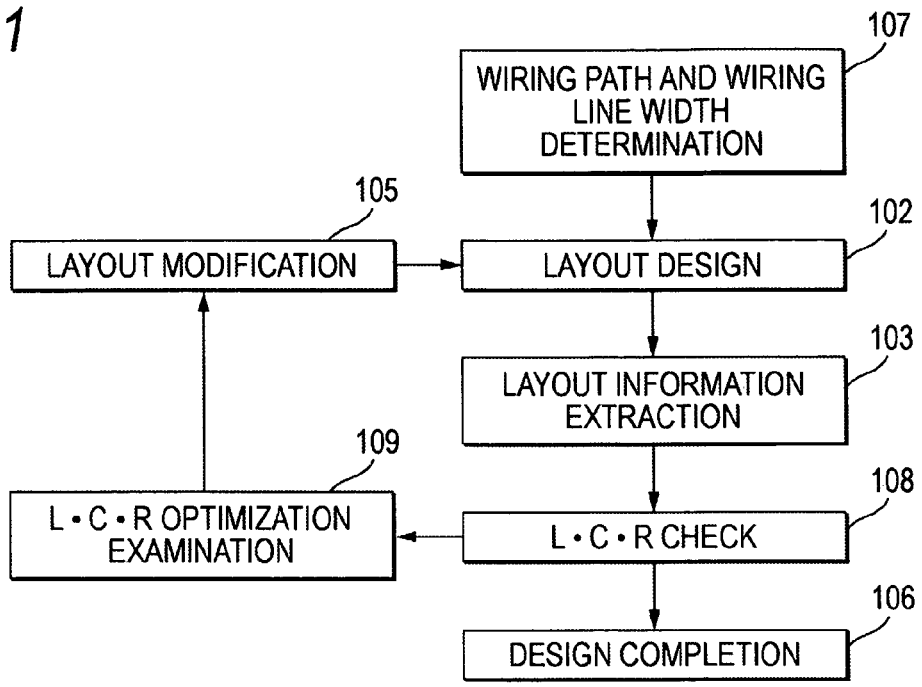
FIG. 11 is a flow chart illustrating a package design method in the related art.
Figure 12:
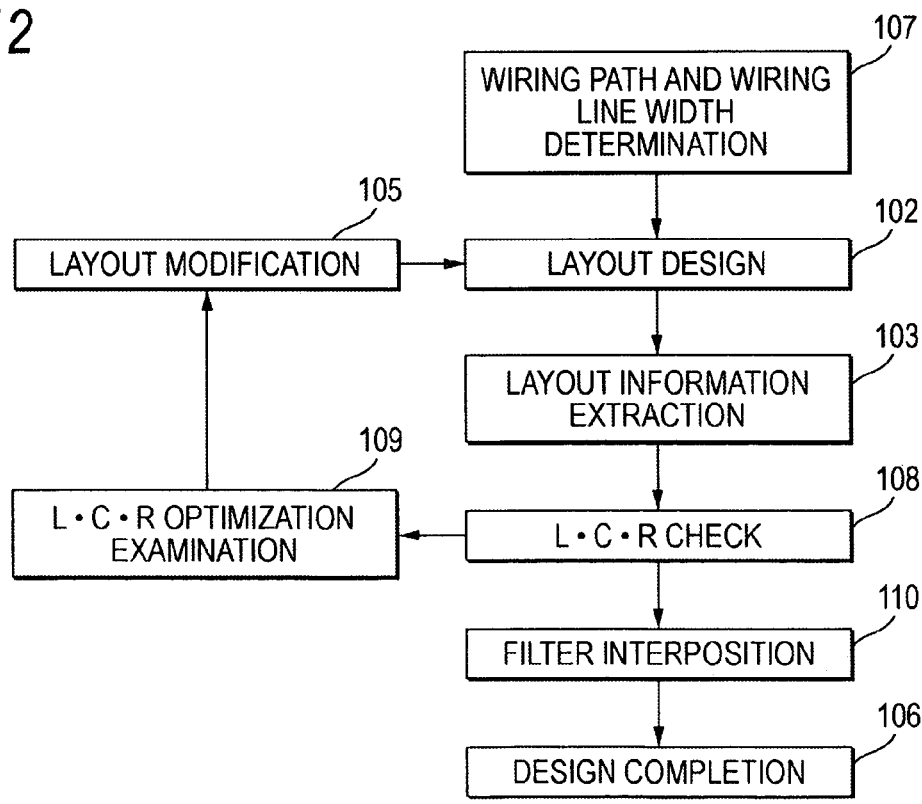
FIG. 12 is a flow chart illustrating a package design method of designing a package, in which a filter is mounted, in the related art.

In addition, an acceptable noise value is set beforehand, and it will be described about definition of the acceptable noise value before setting the acceptable noise value. FIG. 10 is an explanatory view illustrating the setting of an acceptable noise value. In FIG. 10, reference numeral 121 denotes VDD, reference numeral 122 denotes VSS, reference numeral 123 denotes an overshoot signal, reference numeral 124 denotes an undershoot signal, reference numeral 125 denotes a slue, reference numeral 126 denotes a signal waveform, and reference numeral 132 denotes an ideal waveform. A phenomenon that the signal waveform 126 temporarily rises above a predetermined level due to effects of resistance, capacitance, and inductance parasitic on wiring lines is the overshoot 123, and a phenomenon that the signal waveform 126 temporarily falls below a predetermined level is the undershoot 124. Since an increase of values of the overshoot 123 and undershoot 124 causes a product to malfunction, upper and lower limits are defined so as to check that the values of the overshoot 123 and undershoot 124 exist within a range. In addition, the distortion of a waveform due to a difference between input and output of the signal waveform 126 is the slue 125. If the slue 125 becomes large, the operation timing of a product deviates, causing the product to malfunction. In addition, the increase of the slue 125 is a cause of troubles in which, for example, electromigration easily occurs due to an increase of a current consumption. For this reason, the slue 125 is checked.

Next, a package design method according to the embodiment of the invention will be described in detail. FIG. 1 is a flow chart illustrating a package design method in the embodiment of the invention. In FIG. 1, reference numeral 101 denotes a step of setting an acceptable noise value and a limitation, reference numeral 102 denotes a layout design step, reference numeral 103 denotes a layout information extracting step, reference numeral 104 denotes a step of performing simulation (hereinafter, referred to as 'SIM') and checking an amount of noises and a waveform, reference numeral 105 denotes a layout modifying step, and reference numeral 106 denotes a design completing step.

In the invention, first, in the step 101 of setting an acceptable noise value and a limitation, a marginal value of noise with respect to a signal is set and it is determined that each signal line is to be designed according to which limitation. Here, the acceptable noise value refers to an allowed value of the overshoot, undershoot, or slue that occurs with respect to an ideal signal waveform due to effects of resistance, capacitance, and inductance parasitic on signal lines, and the acceptable noise value is set by a design engineer. In addition, the design limitation refers to a rule-base value when performing a wiring process on the basis of a predetermined rule, and the design engineer sets a wiring line width, a wiring line distance, and the like.

Then, in the layout design step 102, signal lines are wired according to the limitation. After the signal lines are wired, resistance, capacitance, and inductance parasitic on each signal line are extracted in the layout information extracting step 103. In the step 104 of performing SIM and checking an amount of noises and a waveform, it is checked the amount of noises occurring in a signal and a slope of a waveform of the signal by using information obtainable in the layout information extracting step 103. In the case when noises having values equal to or larger than the allowable value set in the step 101 of setting an acceptable noise value and a limitation occur, the layout modifying step 105 is performed in which the wiring path, the wiring line width, or the wiring line length is modified, the information on parasitic components is extracted in the layout information extracting step 103, and then it is checked whether or not the amount of noises with respect to a signal on each wiring line exists within an allowable limit in the step 104 of performing SIM and checking an amount of noises and a waveform. By the processes described above, the design is completed.

Here, performing the SIM means performing verification with respect to wiring lines for which the layout design has been performed.

In addition, since it is checked whether or not noises having values equal to or larger than the allowable value exist in a signal on each wiring line of a package in the step 104 of performing SIM and checking an amount of noises and a waveform, it is not necessary to individually adjust the resistance, capacitance, and inductance parasitic on the signal line in the L·C·R check step 108 and the L·C·R optimization examining step 109, unlike in the related art. Accordingly, it is possible to omit an optimization process on L·C·R, which has needed a large number of processes in the related art. As a result, it is possible to reduce the number of processes and to improve the development efficiency. In addition, since malfunction is prevented by suppressing noises within the allowable limit, it is possible to improve the reliability of a semiconductor device.

Figure 2:
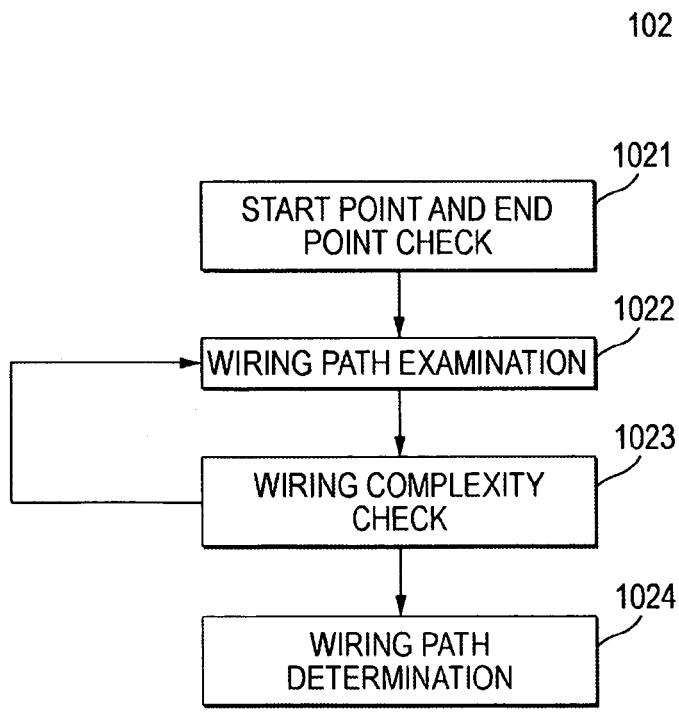
FIG. 2 is a flow chart illustrating details of a layout design in the first embodiment of the invention.

FIG. 2 is a flow chart illustrating details of the layout design step 102. In FIG. 2, reference numeral 1021 denotes a step of checking a start point and an end point, reference numeral 1022 denotes a wiring path examining step, reference numeral 1023 denotes a step of checking a wiring complexity, and reference numeral 1024 denotes a wiring path determining step.

Referring to the flow chart illustrating the details of the layout design step 102, first, in the step 1021 of checking a start point and an end point, a start point and an end point between which a wiring process is to be performed is checked and then a line obtained by connecting the start point with the end point is assumed. Then, in the wiring path examining step 1022, the approximate positions of wiring lines are examined such that the layout limitation on the wiring lines is considered to be satisfied. In the step 1023 of checking a wiring complexity, a portion within a package where the wiring process can be performed is divided into a predetermined number of areas, and the number of wiring lines that can pass through each of the areas and the number of wiring lines that are expected to pass through each of the areas are compared on the basis of a result of the wiring path examining step 1022. Since wiring complexity and short circuit of wiring lines occur in a portion where the number of wiring lines that can pass through the portion is smaller than the number of wiring lines that are expected to pass through the portion, the path is changed again. The process returns to the wiring path examining step 1022 so as to perform the change of the wiring path. If it is determined that all of the wiring lines can be wired, a portion where each of the signal lines is to be disposed is determined in the wiring path determining step 1024. Since a method of examining signal lines is already used for internal wiring lines of an LSI, it is possible to simply examine the signal lines in a package design.

Figure 3:
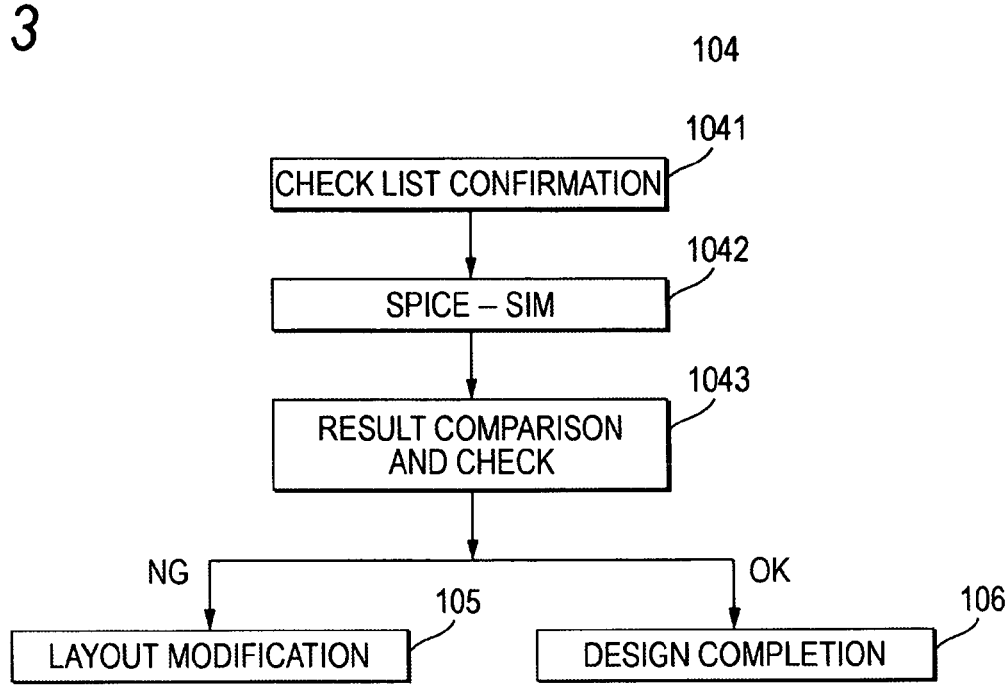
FIG. 3 is a flow chart illustrating details of performing SIM and checking an amount of noises and a waveform in the first embodiment of the invention.

FIG. 3 is a flow chart illustrating details of the step 104 of performing SIM and checking an amount of noises and a waveform. In FIG. 3, reference numeral 1041 denotes a check item confirmation step, reference numeral 1042 denotes a SPICE-SIM step, and reference numeral 1043 denotes a result comparison and check step.

In the check item confirmation step 1041, details of the noise limitation set in the step 101 of setting an acceptable noise value and a limitation are checked and the set items are sequentially checked. In the SPICE-SIM step 1042, SPICE verification with respect to signals is performed on the basis of the information obtained in the layout information extracting step 103.

Here, the SPICE (simulation program with integrated circuit emphasis) verification refers to an industrial standard verification method with respect to a circuit operation and is known as a verification method. It is possible to verify signal waveforms by modeling the signal lines and setting an input signal on the basis of the information obtained in the layout information extracting step 103.

Then, in the result comparison and check step 1043, the verification result is compared with a value, which has been set in the check item confirmation step 1041, and checked. At this time, if the result is above the allowable limit, the process proceeds to the layout modifying step 105 in which a countermeasure is considered. If the result is within the allowable limit, the design is completed in the design completing step 106.

Figure 4:
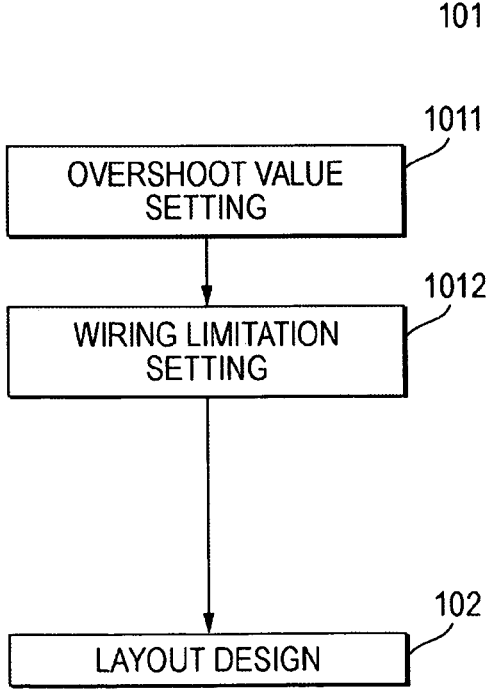
FIG. 4 is a flow chart illustrating details of setting an acceptable noise value and a limitation in the first embodiment of the invention.

FIG. 4 is an explanation related to the first embodiment of the invention and is a flow chart illustrating details of the step 101 of setting an acceptable noise value and a limitation. An acceptable overshoot value with respect to a waveform obtained on the basis of the verification result is set. In FIG. 4, reference numeral 1011 denotes an overshoot value setting step, reference numeral 1012 denotes a wiring limitation setting step, and reference numeral 102 denotes the layout design step.

In the overshoot value setting step 1011, an upper limit on the overshoot of the waveform obtained on the basis of the verification result is set, and then in the wiring limitation setting step 1012, limitation on the signal lines is performed. Thereafter, the process proceeds to the layout design step 102 and then follows the design flow shown in FIG. 1.

Second Embodiment

Figure 5:
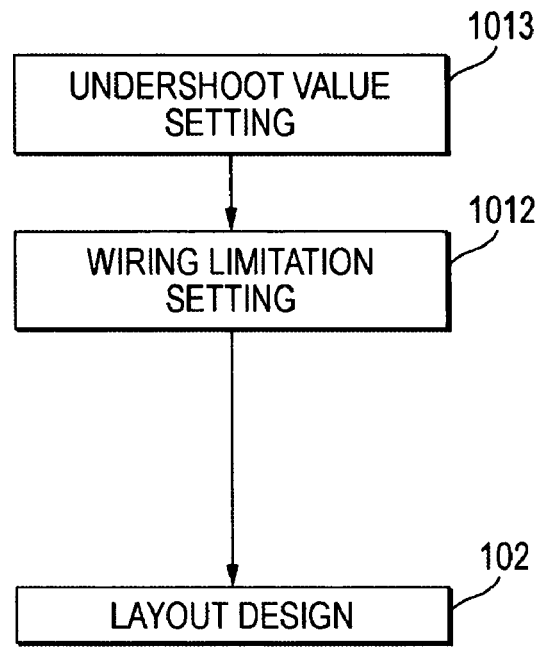
FIG. 5 is a flow chart illustrating details of setting an acceptable noise value and a limitation in a second embodiment of the invention.

FIG. 5 is an explanation related to a second embodiment of the invention and is a flow chart illustrating details of the step 101 of setting an acceptable noise value and a limitation. An acceptable undershoot value with respect to the waveform obtained on the basis of the verification result is set. In FIG. 5, reference numeral 1013 denotes an undershoot value setting step.

In the undershoot value setting step 1013, a lower limit on the undershoot of the waveform obtained on the basis of the verification result is set, and then in the wiring limitation setting step 1012, limitation on the signal lines is performed. Then, the process proceeds to the layout design step 102 and then follows the design flow shown in FIG. 1.

Third Embodiment

Next, a third embodiment of the invention will be described.

Figure 6:
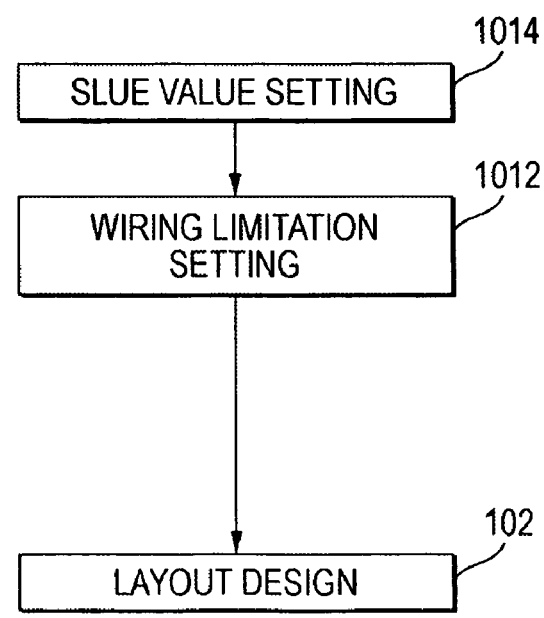
FIG. 6 is a flow chart illustrating details of setting an acceptable noise value and a limitation in a third embodiment of the invention.

FIG. 6 is an explanation related to the third embodiment of the invention and is a flow chart illustrating details of the step 101 of setting an acceptable noise value and a limitation. An allowable slue value with respect to the waveform obtained on the basis of the verification result is set. In FIG. 6, reference numeral 1014 denotes a slue value setting step.

In the slue value setting step 1014, an upper limit on the slue of the waveform obtained on the basis of the verification result is set, and then in the wiring limitation setting step 1012, limitation on the signal lines is performed. Thereafter, the process proceeds to the layout design step 102 and then follows the design flow shown in FIG. 1.

Fourth Embodiment

Next, a fourth embodiment of the invention will be described.

Figure 7:
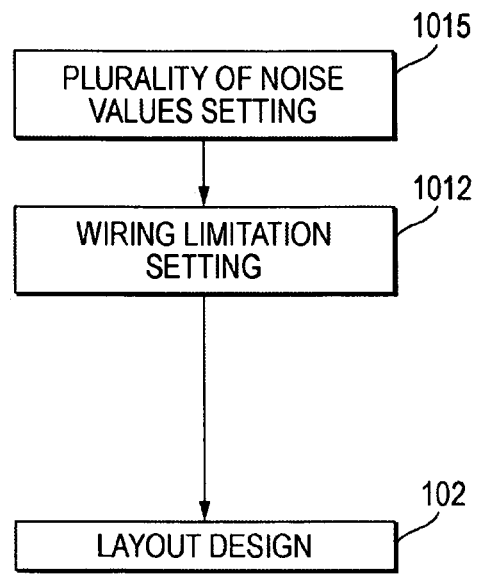
FIG. 7 is a flow chart illustrating details of setting an acceptable noise value and a limitation in a fourth embodiment of the invention.

FIG. 7 is an explanation related to the fourth embodiment of the invention and is a flow chart illustrating details of the step 101 of setting an acceptable noise value and a limitation. A plurality of acceptable noise values with respect to the waveform obtained on the basis of the verification result is set. In FIG. 6, reference numeral 1015 denotes a step of setting a plurality of noise values.

In the step 1015 of setting a plurality of noise values, a value of each of the undershoot, overshoot, and slue with respect to the waveform obtained on the basis of the verification result is set, and then in the wiring limitation setting step 1012, limitation on the signal lines is performed. Then, the process proceeds to the layout design step 102 and then follows the design flow shown in FIG. 1.

In the embodiments described above, an allowable value with respect to each of the undershoot, overshoot, and slue has been set. However, the allowable value is not necessarily set for each of the undershoot, overshoot, and slue. In addition, the invention is not limited to the above-described method. The allowable value may be arbitrarily changed by a design engineer.

Next, a device (design tool) for realizing the design method will be described.

Figure 8:
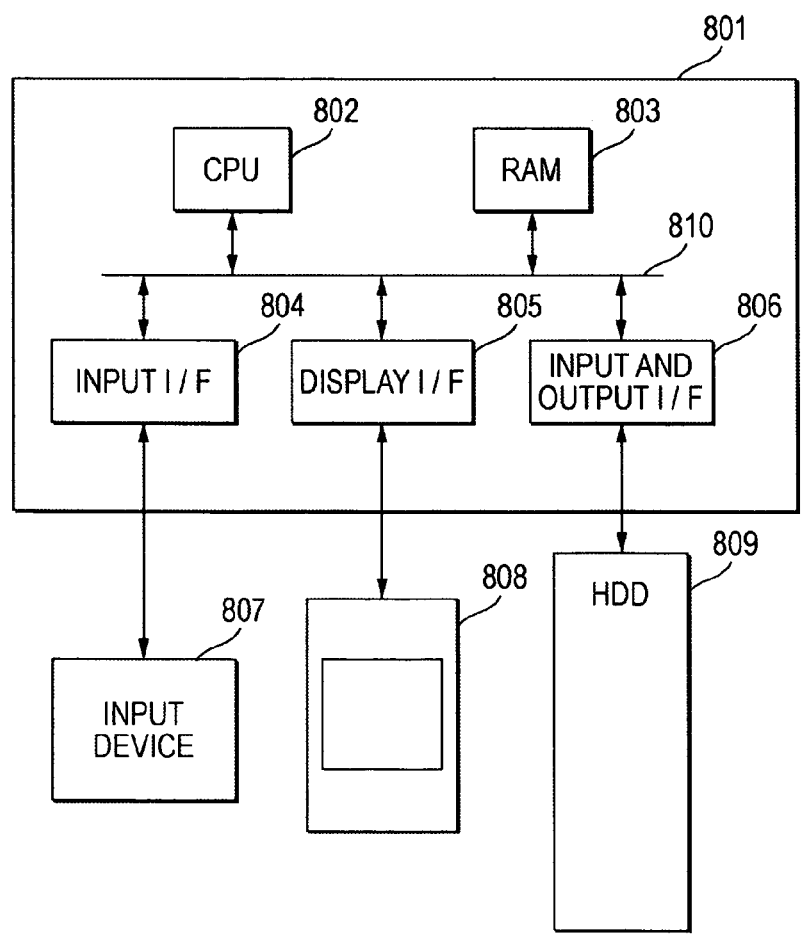
FIG. 8 is a view illustrating a design tool for realizing the design method according to the embodiment of the invention.

FIG. 8 is a view illustrating a tool used in a design environment where the invention is performed. A design tool 801 includes a CPU 802, a RAM 803, an input I/F 804, a display I/F 805, and an input and output I/F 806.

The CPU 802, the RAM 803, the input I/F 804, the display I/F 805, and the input and output I/F 806 are connected to one another through a bus 810, such that data communication therebetween can be performed. The input I/F 804 is connected to an input device 807 from which an input from a design engineer is received. An example of the input device 807 includes a keyboard or a mouse. In addition, the display I/F 805 is connected to a display device 808 through which the design engineer can read layout data or the like. An example of the display device 808 includes a CRT display or a liquid crystal monitor. The input and output I/F 806 is connected to an HDD (hard disk drive) 809. In the HDD 809, a package design tool for performing the package design method according to the embodiment of the invention is stored as a program.

The package design tool may be an independent tool or a tool combined with another tool, such as a design tool for a semiconductor chip. In addition, design data during the package design or design data that is finally obtained is stored in the HDD 809 as necessary.

The CPU 802 causes the package design tool, which is stored as a program in the HDD 809, to be processed on the basis of an instruction from a user, which is input from the input I/F 804. In a process of the program, data is written or read at necessary timing by using the RAM 803 as a work area. The design engineer does not instruct writing and reading of data into the RAM 803 but performs the writing and reading of data into the RAM 803 according to the program stored in the HDD 809. By using the tool described above, the flow according to any one of the first to third embodiments is performed.

Furthermore, the design engineer can check progress information through the display device 808. The data that has been finally generated is output to the HDD 809, and thus the package design is completed.

As described above, in the package design method according to the embodiments of the invention, the acceptable noise value and the wiring limitation with respect to a signal waveform are set, the difference between an ideal waveform and an expected waveform at the time of verification is checked, and thus an optimal design flow is performed. As a result, it is possible to prevent noises on the basis of wiring line information without using a method of independently optimizing the resistance, capacitance, and inductance parasitic on wiring lines in the related art. Moreover, it is possible to prevent a modification in a post-process from being repeatedly performed in the related art. In addition, it is possible to improve the efficiency of the flow by means of the automation or the process simplification not a limited number of design engineers. In addition, it is possible to reduce the number of mounted components for preventing noises.

Thus, it is possible to reduce the number of development processes of a semiconductor device, to improve the reliability due to prevention of malfunction, and to lower the cost of components.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japan Patent Application No. 2005-321169 filed on Nov. 4, 2005, the contents of which are incorporated herein for reference.

What is claimed is:

1. A computer-implemented method of designing a package for a semiconductor device, the method comprising steps of:

setting an acceptable noise value of the package, wherein the package includes a package substrate; a signal line formed on an upper surface of the package substrate; a first connection terminal formed on a bottom surface of the package substrate and electrically connected to the signal line; a second connection terminal connected to the signal line and to a chip mounted on the package substrate; and a sealing resin which covers the package substrate and the chip;

designing via a computer the signal line layout on the basis of information on connection between the package substrate and the chip; and performing an optimization on the signal line layout so that an amount of noise which occurs due to the signal line remains within the acceptable noise value, wherein the performing the optimization step on the signal line layout includes:

analyzing data input to the package and data output from the package; and modifying the signal line layout on the basis of an analysis result obtained in the analyzing process, wherein the analyzing step includes comparing an input waveform input to the second connection terminal with an output waveform output from the first connection terminal and verifying the input waveform and the output waveform.

2. The computer-implemented method according to claim 1, wherein the analyzing step further includes checking a difference between an ideal waveform and the input and output waveforms.

3. The computer-implemented method according to claim 1, wherein performing the optimization includes modifying the signal line layout on the basis of a simulation result based on circuit information on the chip in addition to the analysis result.

4. The computer-implemented method according to claim 1,
wherein, performing the optimization is conducted based on circuit information on the chip in addition to the analysis result.

5. The computer-implemented method according to claim 1, wherein setting the acceptable noise value further includes setting a wiring limitation.

6. The computer-implemented method according to claim 1, wherein performing the optimization includes extracting layout data from the signal line layout; and
wherein the layout data includes information on a width of the signal line and information on arrangement of the signal line.

7. The computer-implemented method according to claim 1, wherein the signal line layout data includes information on the position of the first connection terminal and information on the size of the first connection terminal.

8. The computer-implemented method according to claim 1, wherein the setting step of the acceptable noise value includes setting an acceptable overshoot value with respect to a signal waveform.

9. The computer-implemented method according to claim 1, wherein the setting step of the acceptable noise value includes setting an acceptable undershoot value with respect to a signal waveform.

10. The computer-implemented method according to claim 1, wherein the setting step of the acceptable noise value includes setting an allowable slue value with respect to a signal waveform.

11. The computer-implemented method according to claim 1, wherein the designing step of the signal line layout includes designing the signal line layout on the basis of the information on connection between the package substrate and the chip and information on the sealing resin.

12. The computer-implemented method according to claim 11, wherein the designing step of the signal line layout further includes designing the signal line layout on the basis of information on an additional component to be mounted on the package.

13. The computer-implemented method according to claim 12, wherein the additional component is a filter formed on the package substrate.

14. A layout design tool for performing the computer implemented method for designing the package for the semiconductor device according to claim 1.

15. A method of manufacturing a semiconductor device using the computer-implemented method for designing the package for the semiconductor device according to claim 1.

* * * * *